(12) United States Patent
Cok

(10) Patent No.: US 6,903,378 B2
(45) Date of Patent: Jun. 7, 2005

(54) STACKED OLED DISPLAY HAVING IMPROVED EFFICIENCY

(75) Inventor: Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/607,325

(22) Filed: Jun. 26, 2003

(65) Prior Publication Data

US 2004/0262615 A1 Dec. 30, 2004

(51) Int. Cl.[7] .............................................. H01L 33/00
(52) U.S. Cl. .............................. 257/88; 257/89; 257/98; 257/99
(58) Field of Search .............................. 257/79, 81, 82, 257/88, 89, 98, 99

(56) References Cited

U.S. PATENT DOCUMENTS

| 5,703,436 | A | 12/1997 | Forrest et al. |
|---|---|---|---|
| 6,274,980 | B1 | 8/2001 | Burrows et al. |
| 6,366,025 | B1 | 4/2002 | Yamada |
| 2001/0031509 | A1 | 10/2001 | Yamazaki |
| 2002/0015110 | A1 | 2/2002 | Elliott |
| 2002/0024618 | A1 | 2/2002 | Imai |
| 2002/0186214 | A1 | 12/2002 | Siwinski |
| 2002/0197511 | A1 | 12/2002 | D'Andrade et al. |
| 2003/0010288 | A1 | 1/2003 | Yamazaki et al. |

OTHER PUBLICATIONS

USSN: 10/077,270 by Liao et al., filed Feb 15, 2002.
Klompenhouwer et al., Subpixel Image Scaling for Color Matrix Displays, *SID 02 Digest*, pp. 176–179.

*Primary Examiner*—Thien F Tran
(74) *Attorney, Agent, or Firm*—Andrew J. Anderson; Thomas H. Close

(57) ABSTRACT

An OLED device having a pixel, including a plurality of light transmissive filters; a first electrode layer defining a corresponding plurality of separately addressable electrodes; a first layer of white light emitting OLED material; a doped organic conductor layer; a second layer of white light emitting OLED material; and a second electrode layer defining a single electrode coextensive with the plurality of color filters.

19 Claims, 5 Drawing Sheets

STACKED OLED DISPLAY HAVING IMPROVED EFFICIENCY

FIELD OF THE INVENTION

The present invention relates to OLED color displays and, more particularly, to arrangements of light emitting elements in the pixels of such OLED color displays.

BACKGROUND OF THE INVENTION

US Patent Application No. 2002/0186214A1, by Siwinski, published Dec. 12, 2002, shows a method for saving power in an organic light emitting diode (OLED) display having pixels comprised of red, green, blue and white light emitting elements. The white light emitting elements are more efficient than the other colored light emitting elements and are employed to reduce the power requirements of the display by displaying a black and white image under certain conditions.

OLED devices age as current passes through the emissive materials of the display. Specifically, the emissive materials age in direct proportion to the current density passing through the materials. Hence, the solution proposed by Siwinski will have the effect of either reducing the size of the emissive elements (if four elements occupy the same area as three elements), or reducing the resolution of the device (if four elements take more area than three elements). Hence, the design of Siwinski will result in either reduced lifetime or reduced resolution compared to a prior art three element design.

One approach to dealing with the aging problem, while maintaining the resolution of the display, is to stack the OLED light emitting elements on top of each other thereby allowing the areas of the light emitting elements to be larger to improve lifetime, and/or allowing more pixels to be provided for a given area, thereby improving resolution. This approach is described in U.S. Pat. No. 5,703,436 by Forrest et al., issued Dec. 30, 1997, and U.S. Pat. No. 6,274,980 by Burrows et al., issued Aug. 14, 2001. Stacked OLEDs utilize a stack of light emitting elements located one above another over a substrate. Each light emitting element is individually controlled using conventional controllers. Power is supplied to the light emitting elements from the controller through transparent electrodes which may be shared between light emitting elements adjacent to each other in the stack. However, such stacked structures do not improve the efficiency of the pixels in the display.

It is also known that different OLED materials for emitting different colors of light age at different rates as they are used. It is has been proposed to provide an OLED display having pixels with differently sized red, green and blue light emitting elements, wherein the relative sizes of the elements in a pixel are selected according to their relative aging characteristics to extend the service life of the display. See U.S. Pat. No. 6,366,025 B1, issued Apr. 2, 2002 to Yamada.

White light emitting OLED materials are known in the prior art, for example, US Patent Application No. 2002/0197511 A1 by D'Andrade et al., published Dec. 26, 2002, which is incorporated herein by reference. Such white light emissive materials can provide a very efficient white light source that is several times more efficient than a comparable colored light emitter. It is also known to use white light sources in conjunction with color filter arrays to provide a full color display. For example, a conventional, commercially available transmissive liquid crystal display (LCD) uses such an approach.

The human eye is most sensitive to green light and less sensitive to red and blue light. More specifically, the spatial resolution of the human visual system is driven primarily by the luminance rather than the chrominance of a signal. Since green light provides the preponderance of luminance information in typical viewing environments, the spatial resolution of the visual system during normal daylight viewing conditions is highest for green light, lower for red light, and even lower for blue light when viewing images generated by a typical color balanced image capture and display system. This fact has been used in a variety of ways to optimize the frequency response of imaging systems. For example, as described in US Patent Application No. 2002/0024618 A1 by Imai, published Feb. 28, 2002, in a pixel having a square array of red, green, blue and white light emitting elements, the colors green and white having large luminance components are positioned diagonally opposite in the array. However, the Imai design does not provide increased power efficiency for an emissive full color display.

There is a need, therefore, for an improved fill color flat panel OLED display having improved lifetime and power efficiency and a simpler construction.

SUMMARY OF THE INVENTION

The need is met according to the present invention by providing an OLED device having a pixel that includes a plurality of light transmissive filters; a first electrode layer defining a corresponding plurality of separately addressable electrodes; a first layer of white light emitting OLED material; a doped organic conductor layer; a second layer of white light emitting OLED material; and a second electrode layer defining a single electrode coextensive with the plurality of color filters.

ADVANTAGES

The present invention provides a full color flat panel OLED display having improved lifetime and power efficiency and a simpler construction.

DETAILED DESCRIPTION OF THE INVENTION

Figure 1:
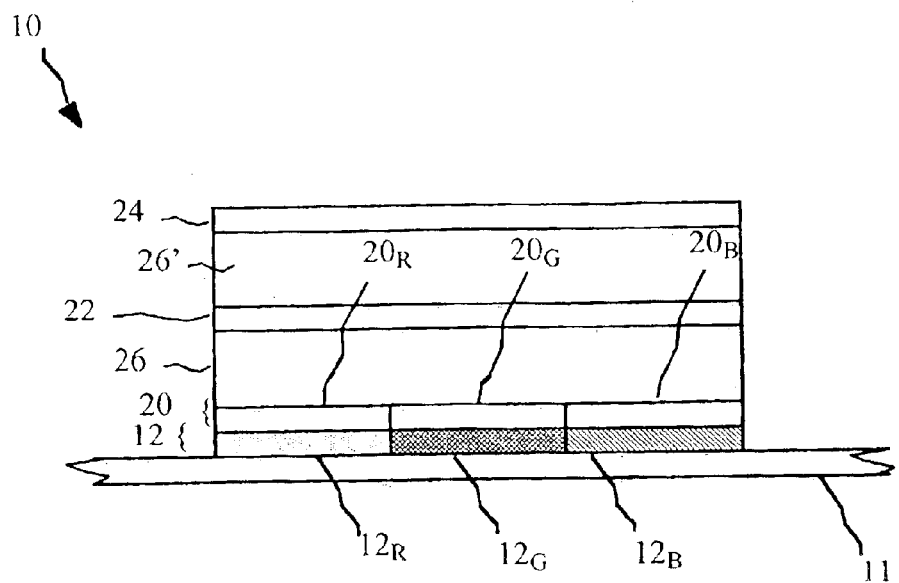
FIG. 1 is a schematic side view of a bottom emitting stacked OLED pixel according to one embodiment of the present invention.

Referring to FIG. 1, a bottom emitting OLED device according to the present invention includes a color pixel 10 located on a substrate 11 having a filter layer 12 including a plurality of light transmissive filters $12_R$, $12_G$, $12_B$ for transmitting red, green and blue light respectively. A first patterned electrode layer 20 defines a corresponding plurality of separately addressable electrodes $20_R$, $20_G$ and $20_B$. A first layer of white light emitting OLED material 26 is disposed over electrode layer 20. A second layer of white light emitting OLED material 26' is electrically connected in series with the first layer through a transparent doped organic conductor layer 22. A second electrode layer 24 defines a single electrode coextensive with the plurality of color filters. First electrode layer 20 is transparent and second electrode layer 24 may be reflective. Transparent electrodes are well known in the art and, for example, may be made of indium tin oxide (ITO) or thin layers of metal such as silver. Reflective electrodes are also well known and may, for example, be composed of thicker layers of metals such as silver or aluminum.

The white light emitting OLED materials in layer 26 can comprise multiple layers including charge injection, charge transport, and light emissive layers as is known in the art. The layers 26 and 26' of white light emitting OLED materials, the doped organic conductor layer 22 and the second electrode layer 24 may be continuous layers, thereby simplifying the manufacture of the device. The relative positions of the patterned and unpatterned first and second electrode layers 20 and 24 may be reversed. Such a structure is described in detail in U.S. Ser. No.: 10/077,270 by Liao et al., filed Feb. 15, 2002, which is incorporated herein by reference. Color filters and their deposition are also well known in the art and may include absorptive filters having, for example, pigments or dyes, or dichroic filters.

In operation, a current is selectively passed through the first and second layers of white light emitting OLED materials 26 and 26' and through the doped organic conductive layer 22 via the first and second electrode layers to produce white light that is filtered by the filters in filter layer 12 to produce a desired color and intensity of light that is emitted from the pixel through the substrate 11. A white color may be produced by emitting light through all of the color filters simultaneously.

Figure 2:
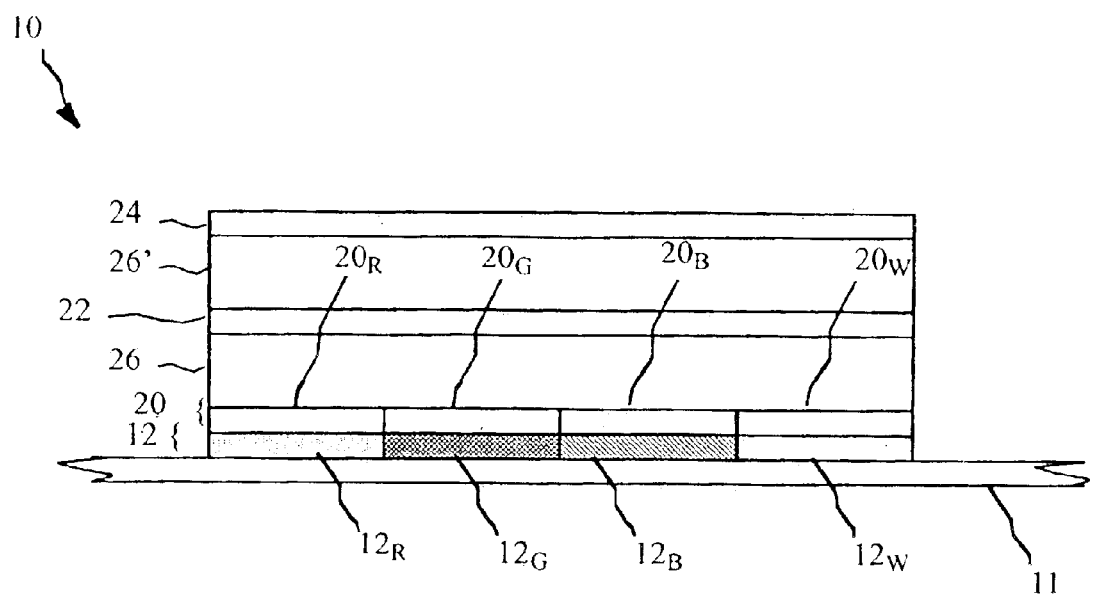
FIG. 2 is a schematic side view of a bottom emitting stacked OLED pixel according to an alternative embodiment of the present invention.

Referring to FIG. 2, in an alternative embodiment, the color pixel 10 may include an additional white light transmissive filter $12_W$ and separately addressable electrode $20_W$. The white light transmissive filter may comprise a clear portion of the filter layer 12, or alternatively a gap in filter layer 12. A clear portion may be employed to improve process or materials stability and reduce layer interactions. This arrangement operates in a similar fashion to the embodiment shown in FIG. 1 except that a white color may be produced either by emitting light through all of the color filters simultaneously, and/or by emitting white light through the clear filter.

Figure 3:
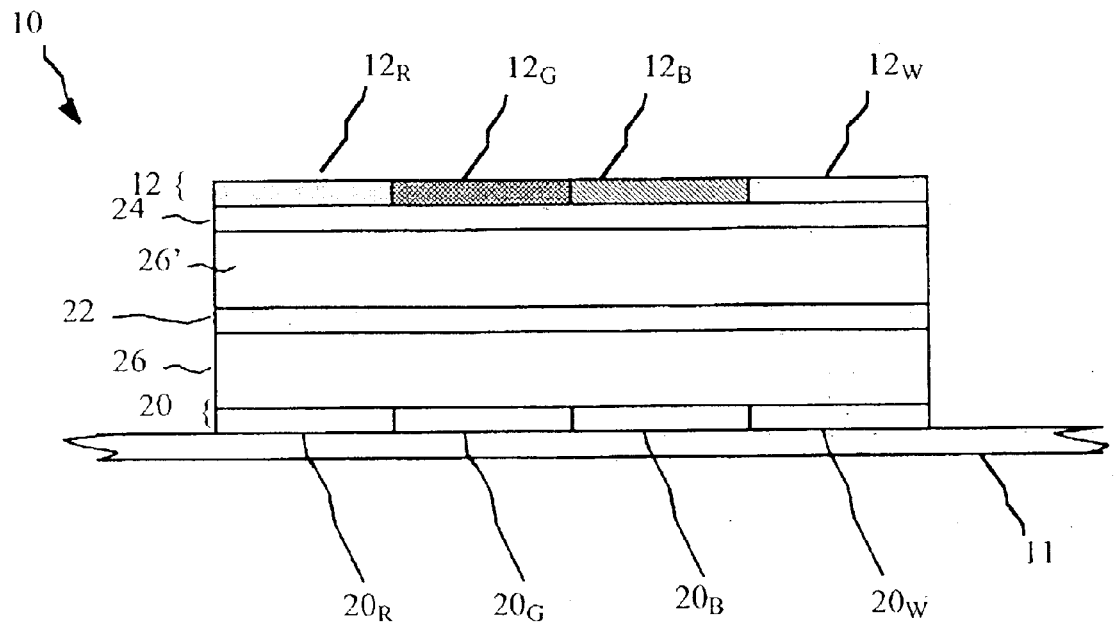
FIG. 3 is a schematic side view of a top emitting stacked OLED pixel according to one embodiment of the present invention.

Alternatively, the OLED device may be top emitting (as shown in FIG. 3) wherein the filter layer 12 is located over the second electrode layer 24 rather than under the first electrode layer 20 and light is emitted through the filters away from the substrate. In the top emitting configuration, first electrode layer 20 may be reflective and second electrode layer 24 is transparent. The top emitting device operates in a similar fashion to the bottom emitting device.

Figure 4:
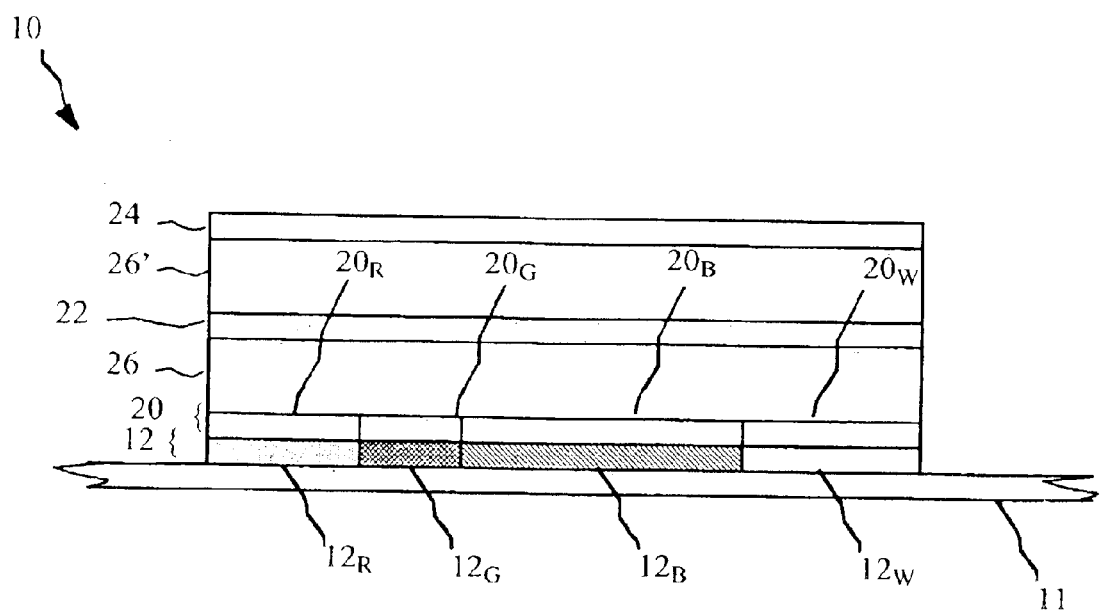
FIG. 4 is a schematic side view of a bottom emitting stacked OLED pixel having differently sized filters according to an alternative embodiment of the present invention.

Referring to FIG. 4, it may be desirable to adapt the relative sizes of the filters in filter layer 12 to match the expected usage of the display. Since the light emitting elements age with use in proportion to the density of the current passed through them, adjusting the relative sizes of the light emitting elements to correspond to the expected usage of the light emitting elements will enable the elements to have a similar lifetime. For example, if a pixel emits primarily red colors, the white light emitting OLED materials in layers 26 and 26' located between electrode $20_R$ and electrode layer 24 will age faster. Differences in aging related to usage differences can be accommodated by providing differently sized filters in filter layer 12 and corresponding electrodes in electrode layer 20. FIG. 4 illustrates a display having a larger blue color filter $12_B$ and corresponding electrode $20_B$ and a smaller green filter $12_G$ and corresponding electrode $20_G$.

Figure 5:
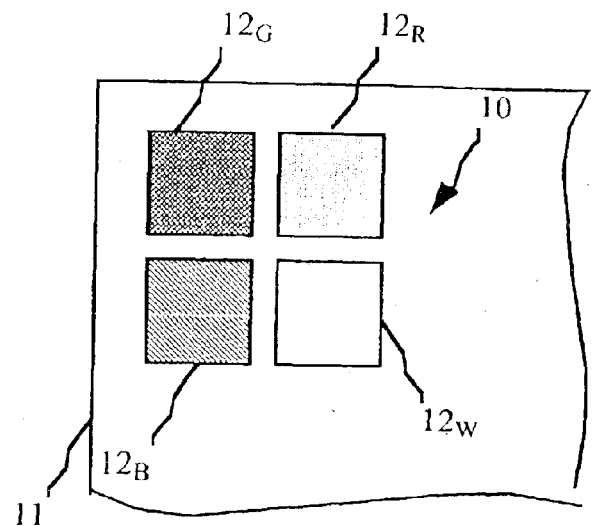
FIG. 5 is a schematic top view of a stacked OLED pixel according to an alternative embodiment of the present invention.
Figure 6:
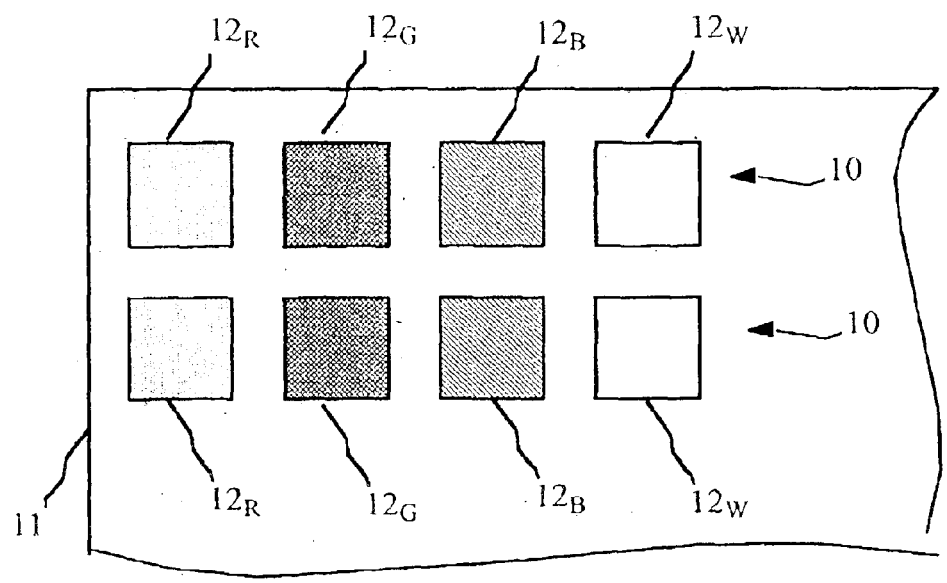
FIG. 6 is a schematic top view of a stacked OLED pixel according to an alternative embodiment of the present invention.
Figure 7:
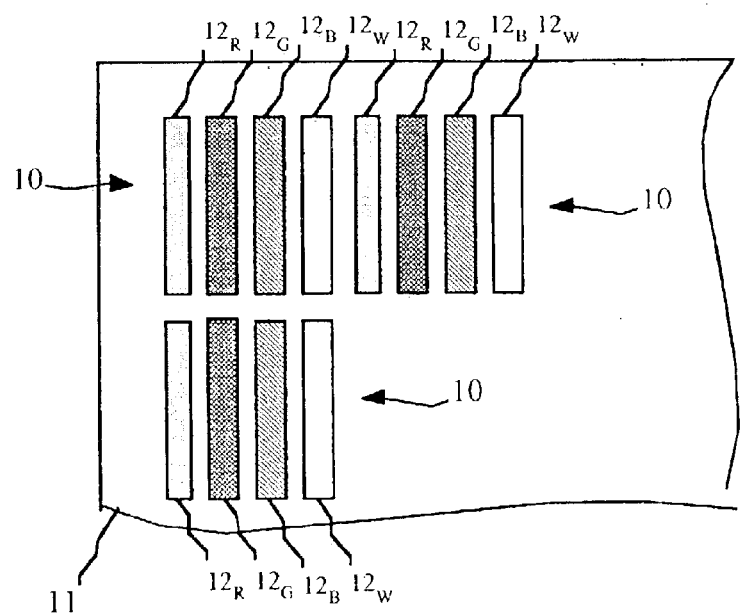
FIG. 7 is a schematic top view of a stacked OLED pixel according to an alternative embodiment of the present invention.

FIGS. 1–4 are side views of pixels according to the present invention. These pixels can be laid out in a variety of ways on substrate 11 as are shown in FIGS. 5–7. Referring to FIG. 5, the light transmissive filters in filter layer 12 may be arranged in an array. Alternatively, as shown in FIG. 6, each light transmissive filter may be square and the pixels may be arranged on the substrate 11 to form stripes of common colors. In yet another alternative, as shown in FIG. 7, the light transmissive filters may be rectangular and form stripes of common colors while each color pixel 10 is more nearly square.

In operation, conventional controls known in the prior art such as those found in active or passive matrix OLED displays are used to provide current through the first and second electrode layers 20, 24 and through the first and second white light emitting OLED material layers 26 and 26'. As current passes through the light emitting OLED materials, the light emitting OLED materials emit light. Those OLED materials located above a color filter will emit light that passes through the layer of transmissive filters 12 to emit colored light. Since white light emitting OLED materials may be more efficient than colored light emitting materials, the present invention can be more efficient than designs using colored light emitting materials. Moreover, those light emitting materials located above a clear, or no filter, will efficiently emit white light since it does not pass through a color filter.

All of the white light that passes through the color filters that is not of the same color as the color filter, is absorbed. Hence, the white light emitter that emits light through the clear, or no filter, is more efficient and the present invention provides a higher efficiency display. At the same time, the use of the second layer 26' of light emitting OLED material provides additional light emitting capacity and to produce a given amount of light, will require a lower current density than a conventional single layer design. The lower current density increases the lifetime of the display.

The embodiments shown in FIGS. 2, 3 and 4 provide a multi-color pixel wherein one of the colors is white and the remainder are colored. The additional white pixel element can be used as a high efficiency white light source without increasing the area of the pixel or decreasing the area of the light emitting elements, thereby providing a more power efficient display with improved lifetime while maintaining the resolution of the display. Only one light emissive material may be used and may be deposited in a continuous layer over the electrodes. Moreover, the second electrode 24 may be common to all color pixels 10 on the device. Therefore, the present invention provides a simple structure providing improved efficiency, lifetime, and a simplified manufacturing process.

Figure 8:
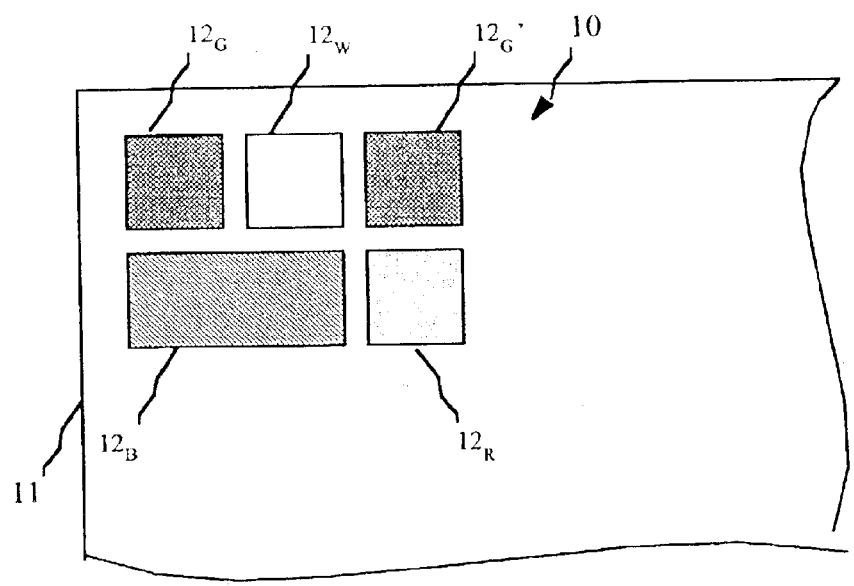
FIG. 8 is a schematic top view of a stacked OLED pixel according to an alternative embodiment of the present invention.

Other pixel structures having a plurality of spatially separated luminance elements (i.e. green and/or white light emitting elements) can provide a display device with higher spatial resolution while providing uniform luminance in flat fields of constant color. Since spatially separated green elements can improve the spatial resolution of a display, a plurality of green elements can also be employed in the pixel. Referring to FIG. 8, a color pixel 10 having light emitting elements that embodies this principle includes a plurality of green filters $12_G$ and $12_G'$ and a blue filter $12_B$ that is larger than the other filters. A variety of such arrangements are possible.

According to the embodiments shown in FIGS. 2–4, luminance that could be produced by a combination of lower power efficiency light emitted through the color filters can instead be produced by emitting light through the higher power efficiency clear filter. Thus, any unsaturated color can be more efficiently reproduced by emitting light through the clear filter together with light emitted through one or more of the other colored filters.

A suitable transformation function may be provided by a signal processor that converts a standard RGB color image signal to a power saving RGBW image signal that is employed to drive the display of the present invention. For example, a simple transform is to calculate the minimum of the original red, green, and blue values and replace each of these color values with the same value less the minimum. The white value is set to the minimum. Applicants have done a study establishing that, on average, images displayed using a white light emitter that is at least three times as efficient as a color emitter (which is likely the case for colored light created from filtered white light) will result in overall power savings of 50% in some applications.

Figure 9:
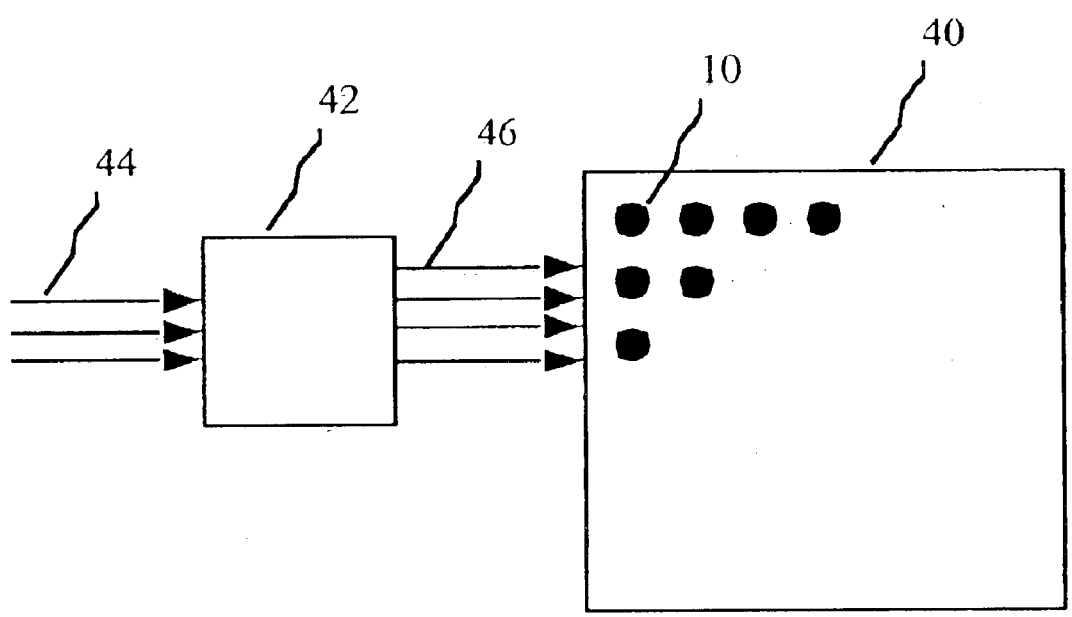
FIG. 9 is a schematic diagram of a display having stacked OLED pixels according to the present invention.

Referring to FIG. 9, a color OLED display having stacked pixels with color filters according to the present invention includes a display panel 40 having color pixels 10 and a controller 42. The controller 42 converts a standard RGB color image signal 44 to a power-saving RGBW color image signal 46 suitable for driving the display panel 40, and can include a general purpose microprocessor or special purpose digital signal processing circuit as is known in the art.

The color of the white light emitted by the first and second white light emitting OLED material layers 26 and 26' may be designed to match a desired white point of the display. In this case, the controller used to drive the display is configured to allow any gray value, including white, which would otherwise be presented using a combination of the light emitted through the color filters in filter layer 12 to be created using primarily the white light emitted through the clear filter. To achieve this, the peak luminance of the emitted white light is designed to match the combined luminance of the combined luminance of the light emitted through the colored filters.

It should be noted however, that under certain circumstances it may be desirable to design the color of the white light emitting material 26 to provide a color point other than the display white point inside the gamut defined by the red, green, and blue color filters. For example by biasing the color of the light emitted by the white light emitting OLED material layers 26 and 26' towards the color of one of the color filters, the designer can reduce the reliance of the display on light emitted through that color filter. This approach can be used to adjust the relative lifetimes and/or power efficiency of the pixel.

The OLED materials in layers 26 and 26' may be identical and may emit the same color of white light when current is passed through the layers. Alternatively, the white light emitting OLED materials in layer 26 may be different from those in layer 26' so that the combined light emitted by the different materials provides a preferred white point for the display.

It may also be desirable to set the peak luminance of the white light emitted through the clear filter relative to the luminance of the combined light emitted through the color filters. This increases reliance on light emitted through the color filters while reducing reliance on light emitted through the clear filter.

Once the display is designed to provide the correct luminance values, suitable hardware is employed to map from a conventional three channel data signal to a four channel signal, for example using a suitable look-up table or matrix transform as is known in the art. Alternatively, the conversion may be accomplished real time using an algorithm (such as that described above) that specifies the conversion. The signal conversion is implemented in the controller 42.

It should be noted that the signal conversion described above does not consider the spatial layout of the OLEDs within the display device. However, it is known that traditional input signals assume that all of the OLEDs used to compose a pixel are located in the same spatial location. Visually apparent artifacts that are produced as a result of having the different colored OLEDs at different spatial locations are often compensated for by using spatial interpolation algorithms, such as the one discussed by Klompenhouwer et al. entitled "Subpixel Image Scaling for Color Matrix Displays," SID 02 Digest, pp. 176–179. These algorithms will, depending upon the spatial content of the image, adjust the drive signal for each OLED to reduce the visibility of spatial artifacts and improve the image quality of the display, particularly near the edges of objects within the image and will be applied in conjunction with or after the before-mentioned signal conversion is applied. It should be noted that the image quality improvement that is obtained near the edges of objects within the image is derived from increased sharpness of edges, decreases in the visibility of color fringing and improved edge smoothness. The spatial interpolation algorithm may be implemented in the controller 42.

Because the transform from three to four colors is non-deterministic (i.e. many colors in the conventional specification can be created with either combinations of the color elements alone or in one of many combinations with the additional element), different conversions are possible. However, by selecting the peak luminance of the white light transmitted through the clear filter to match the combined luminances of light transmitted through the color filters, it is possible to perform the conversion to allow the light transmitted through the clear filter to provide as much luminance to each color as possible while maintaining saturation of all colors. This approach provides the maximum power savings possible with the present invention.

The present invention can be employed in most OLED device configurations that employ an efficient white light emitting material. These include simple structures comprising a separate anode and cathode per OLED and more complex structures, such as passive matrix displays having orthogonal arrays of anodes and cathodes to form pixels, and active matrix displays where each pixel is controlled independently, for example, with a thin film transistor (TFT). As is well known in the art, OLED devices and light emitting layers include multiple organic layers, including hole and electron transporting and injecting layers, and emissive layers. Such configurations are included within this invention.

The invention has been described in detail with particular reference to certain preferred embodiments thereof, but it will be understood that variations and modifications can be effected within the spirit and scope of the invention.

PARTS LIST 10 color pixel
11 substrate
12 filter layer
$12_R$, $12_G$, $12_B$, $12_W$ light transmissive filters
20 first electrode layer
$20_R$, $20_G$, $20_B$, $20_W$ electrode
22 transparent doped organic conductor layer
24 second electrode layer
26 first white light emitting OLED material layer
26' second white light emitting OLED material layer
40 display panel
42 controller
44 RGB color image signal
46 power saving RGBW color image signal.

What is claimed is:

1. An OLED device having a pixel, comprising:
   a) a plurality of light transmitting filters;
   b) a first electrode layer defining a corresponding plurality of separately addressable electrodes;
   c) a first layer of white light emitting OLED material;
   d) a doped organic conductor layer;
   e) a second layer of white light emitting OLED material; and
   f) a second electrode layer defining a single electrode coextensive with the plurality of filters.

2. The OLED device claimed in claim 1, wherein the filters include red, green and blue light transmitting filters.

3. The OLED device claimed in claim 1, wherein the filters include a white light transmitting filter.

4. The OLED device claimed in claim 1, wherein the light transmitting filters have different sizes.

5. The OLED device claimed in claim 1, wherein the device is a top emitting OLED device.

6. The OLED device claimed in claim 1, wherein the device is a bottom emitting OLED device.

7. The OLED device claimed in claim 1, wherein two or more of the light transmitting filters transmit the same color of light.

8. The OLED device claimed in claim 7, wherein the two or more filters transmit green light.

9. The OLED device claimed in claim 7, wherein the two or more filters transmit white light.

10. The OLED device claimed in claim 1, wherein the first and second layers of white light emitting OLED material are the, same material.

11. The OLED device claimed in claim 1, wherein the first and second layers of white light emitting OLED material are different materials.

12. The OLED device claimed in claim 1 wherein the white point of the white light emitting OLED materials matches the white point of the display.

13. The OLED device claimed in claim 1, wherein the filters are absorption filters.

14. The OLED device claimed in claim 1, wherein the filters are dichroic filters.

15. The OLED device claimed in claim 1, wherein the relative areas of the light transmitting filters is chosen to match the relative usage of the color of light transmitting filter.

16. The OLED device claimed in claim 1, wherein the pixel has a square shape and the filters are arranged in a stripe pattern in the square shape.

17. The OLED device claimed in claim 1, wherein the pixel has a square shape and the filters are arranged in a rectangular array in the square shape.

18. The OLED device claimed in claim 1, wherein the filters include red, green, blue and white filters, and further comprising a controller for converting an RGB color image signal to an RGBW signal.

19. The OLED device claimed in claim 18, wherein the controller determines the minimum (MIN) of the RGB signal and produces the RGBW signal as R=R−MIN, G=G−MIN, B=B−MIN, W=MIN.

* * * * *